(12) United States Patent
Fujii

(10) Patent No.: US 8,094,457 B2
(45) Date of Patent: Jan. 10, 2012

(54) ELECTRONIC APPARATUS

(75) Inventor: Tomoharu Fujii, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 351 days.

(21) Appl. No.: 11/847,796

(22) Filed: Aug. 30, 2007

(65) Prior Publication Data
US 2008/0259585 A1 Oct. 23, 2008

(30) Foreign Application Priority Data

Sep. 27, 2006 (JP) .................. 2006-263083

(51) Int. Cl.
*H05K 5/00* (2006.01)

(52) U.S. Cl. ........ 361/750; 361/816; 361/818; 257/789; 257/795; 257/796

(58) Field of Classification Search .......... 361/750, 361/818; 257/789, 795, 796; 347/742, 702, 347/867
See application file for complete search history.

(56) References Cited

U.S. PATENT DOCUMENTS

| 5,154,973 A * | 10/1992 | Imagawa et al. ............. 428/325 |
| 7,363,017 B2 * | 4/2008 | Miya et al. ................... 455/300 |
| 7,435,625 B2 * | 10/2008 | Condie et al. ................. 438/124 |
| 2003/0143958 A1 * | 7/2003 | Elias et al. ...................... 455/73 |
| 2003/0161200 A1 * | 8/2003 | Fujiwara ....................... 365/200 |
| 2004/0222924 A1 * | 11/2004 | Dean et al. ............. 343/700 MS |
| 2005/0003199 A1 * | 1/2005 | Takaya et al. ................. 428/413 |
| 2005/0090300 A1 * | 4/2005 | Zhang et al. ............... 455/575.7 |
| 2005/0117312 A1 * | 6/2005 | Kimura et al. ................ 361/746 |
| 2006/0035613 A1 * | 2/2006 | Miya et al. ................. 455/276.1 |
| 2006/0221591 A1 * | 10/2006 | Kong ............................. 361/818 |
| 2009/0046028 A1 * | 2/2009 | Han et al. ...................... 343/787 |

FOREIGN PATENT DOCUMENTS

| JP | 2035803 | 2/1990 |
| JP | 10-93332 | 4/1998 |
| JP | 2002217638 | 8/2002 |
| JP | 2003347834 | 12/2003 |
| JP | 2004-159287 | 6/2004 |
| JP | 2005005797 | 1/2005 |
| JP | 2005005866 | 1/2005 |
| JP | 2005051576 | 2/2005 |
| JP | 2005-191827 | 7/2005 |

* cited by examiner

*Primary Examiner* — Yuriy Semenenko
*Assistant Examiner* — Andargie M Aychillhum
(74) *Attorney, Agent, or Firm* — Rankin, Hill & Clark LLP

(57) ABSTRACT

An electronic apparatus includes a substrate, electronic components mounted on the substrate, an antenna mounted on the substrate, and a resin material containing a dielectric constant adjusting material added therein, and sealing the electronic components and the antenna.

16 Claims, 4 Drawing Sheets

ELECTRONIC APPARATUS

This application claims priority to Japanese Patent Application No. 2006-263083, filed Sep. 27, 2006, in the Japanese Patent Office. The priority application is incorporated by reference in its entirety.

TECHNICAL FIELD

The present disclosure relates to an electronic apparatus including an electronic component and an antenna mounted therein.

RELATED ART

For example, there are various types of electronic apparatuses including electronic components such as active elements and passive elements mounted therein. In recent years, for example, electronic apparatuses having a radio communication module including a radio frequency (RF) communication unit, a MCU (microcomputer) unit, a quartz oscillator, and the like have often come into use in various situations.

FIG. 1 is a view showing the outline of an electronic apparatus having a radio communication module. By reference to FIG. 1, the electronic apparatus shown in this view has a structure in which a plurality of electronic components 2 and 3 forming the radio communication module are mounted on a wiring substrate 1.

Further, the electronic apparatus performs radio communication by the use of an antenna. Therefore, on the wiring substrate 1, an antenna 4 formed of a patterned electrically conductive layer is formed.

Further, in the electronic apparatus shown in FIG. 2, a chip antenna 5 is mounted in place of the antenna 4 shown in FIG. 1. On the wiring substrate 1, antenna matching components 6 to be used with the chip antenna 5 are mounted in the vicinity of the chip antenna 5.

[Patent Document 1] Japanese Patent Unexamined Publication No. 2004-159287

[Patent Document 2] Japanese Patent Unexamined Publication No. 2005-191827

[Patent Document 3] Japanese Patent Unexamined Publication No. 10-93332

However, for the electronic apparatus, the area of the mounting substrate occupied for the antenna is large, which may unfavorably present a problem for the reduction in size of the electronic apparatus.

For example, in the case of the electronic apparatus shown in FIG. 1, in order to perform patterning of the antenna 4 so that the electronic apparatus has a prescribed performance, the area occupied on the wiring substrate 1 increases, resulting in a difficulty in reduction of the size of the electronic apparatus.

Further, in the case of the electronic apparatus shown in FIG. 2, although the chip antenna 5 is smaller than the antenna 4 (antenna pattern), it is required to be used together with the antenna matching components 6. For this reason, considering both the chip antenna and the antenna matching components, unfavorably, the area occupied on the wiring substrate increases.

SUMMARY

Exemplary embodiments of the present invention provide a novel and useful electronic apparatus.

Exemplary embodiments of the present invention provide an electronic apparatus including an electronic component and an antenna mounted therein, the size of which is reduced.

An electronic apparatus according to one or more exemplary embodiments comprises: a substrate; an electronic component mounted on the substrate; an antenna mounted on the substrate; and a resin material containing a dielectric constant adjusting material added therein, and sealing the electronic component and the antenna.

In accordance with one or more exemplary embodiments of the present invention, it becomes possible to reduce the size of an electronic apparatus including an electronic component and an antenna mounted therein.

Further, it is also acceptable that the dielectric constant adjusting material includes SiC or SiN.

Still further, it is also acceptable that the dielectric constant adjusting material includes a metal compound.

Furthermore, it is also acceptable that a metal forming the metal compound includes any of Al, Ti, Ta, and Zr.

Whereas, it is also acceptable that the metal compound includes $Al_2O_3$ or AlN.

Further, it is also acceptable that the dielectric constant adjusting material is added such that the dielectric constant of the resin is higher in the vicinity of the antenna than in the vicinity of the electronic component.

In accordance with one or more exemplary embodiments of the present invention, it becomes possible to reduce the size of the electronic apparatus including an electronic component and an antenna mounted therein.

Other features and advantages may be apparent from the following detailed description, the accompanying drawings and the claims.

DETAILED DESCRIPTION

An electronic apparatus in accordance with exemplary embodiments of the present invention includes: a substrate; an electronic component mounted on the substrate; an antenna mounted on the substrate; and a resin material containing a dielectric constant adjusting material added therein, and sealing the electronic component and the antenna.

For example, addition of a powder of a metal compound (metal oxide or metal nitride) high in dielectric constant to the resin material enables the increase in dielectric constant of the resin material. Further, as the dielectric constant adjusting material, SiC or SiN may be used. The foregoing configuration enables the reduction of the size of the antenna surrounded by the resin material high in dielectric constant.

Further, it enables the reduction of the size of the electronic apparatus including an electronic component and an antenna mounted therein.

Then, specific examples of the structure of the electronic apparatus will be described by reference to the accompanying drawings.

Example 1

Figure 3:
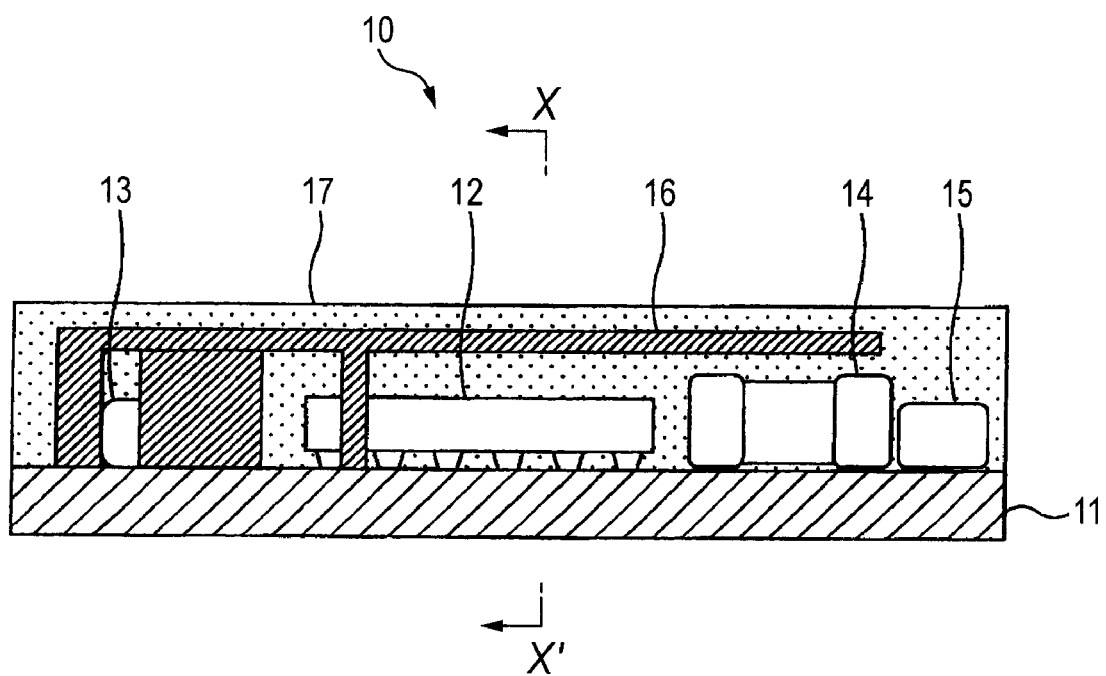
FIG. 3 is a view showing an electronic apparatus in accordance with Example 1.

FIG. 3 is a view schematically showing an electronic apparatus 10 in accordance with Example 1 of the present invention. By reference to FIG. 3, the outline of the electronic apparatus 10 in accordance with this invention is configured as follows. On a wiring substrate 11, electronic components 12 to 15, and an antenna 16 are mounted. Further, the electronic components 12 to 15, and the antenna 16 are sealed with a resin material 17.

For example, the electronic component 12 includes an active element, and the electronic components 13 to 15 include passive elements. However, the number of the electronic components, and the ratio of the active elements and the passive elements are not limited thereto. Thus, various changes (increases or decreases) may be made for the arrangement.

For example, when the electronic components on the wiring substrate 11 form a radio communication module, the electronic component 12 corresponding to a radio frequency (RF) communication unit or a MCU (microcomputer) unit, and the electronic components 13 to 15 such as quartz oscillators and capacitors are mounted on the wiring substrate 11.

The electronic apparatus in accordance with this example is wherein, to the resin material 17, a dielectric constant adjusting material for adjusting the dielectric constant of the resin material 17 is added. For example, by using a material higher in dielectric constant than related-art epoxy type resin materials (with a dielectric constant of about 4) as the dielectric constant adjusting material, it is possible to increase the dielectric constant of the resin material 17.

As a result, the periphery of the antenna 16 is surrounded by a high dielectric constant material (with a dielectric constant of about 8 to 20). Therefore, a small size of the antenna 16 is enough for obtaining the same characteristics as in the related art. This enables the reduction of the size of the electronic apparatus 10.

Further, when for the dielectric constant adjusting material, for example, a metal compound is used, it is possible to increase the dielectric constant of the resin material with ease. As the metal for forming the metal compound, for example, any of Al, Ti, Ta, and Zr can be used. Alternatively, these metals or metal compounds may also be used in mixture.

For example, as specific examples of the metal compound, $Al_2O_3$ as a metal oxide, and AlN as a metal nitride are common, and readily available and can be manufactured at a low cost, and hence preferable. Particularly, $Al_2O_3$ is high in dielectric constant, and is easily formed in a powder (particle) shape for being added to the resin material. For these reasons, $Al_2O_3$ is preferable as the dielectric constant adjusting material. Further, the dielectric constant adjusting materials are not limited to these materials. For example, materials expressed as $Ti_xO_y$, $Ta_mO_n$, and $Zr_pO_q$ (where x, y, m, n, p, and q are each an integer) may be used.

Whereas, as the dielectric constant adjusting material, for example, a silicon compound such as SiC or SiN can also be used. For example, a mold resin (epoxy type or polyimide type resin) may contain a material containing $SiO_2$ referred to as silica as a main component added therein as a filler. However, $SiO_2$ has a dielectric constant of about 4. Therefore, by using a silicon compound such as SiC or SiN higher in dielectric constant than silica as the dielectric constant adjusting material, it is possible to increase the dielectric constant of the resin material.

By adding a proper amount of the dielectric constant adjusting material to, for example, a general mold resin, it becomes possible to adjust (increase) the dielectric constant of the resin material to a desirable value.

Whereas, when the amount of the dielectric constant adjusting material to be added is too small, a sufficient effect of increasing the dielectric constant cannot be obtained. On the other hand, when the addition amount is too large, the physical properties as the resin are lost, so that the curing of the resin becomes difficult. Therefore, the dielectric constant adjusting material is preferably added in an amount of about 70 vol % to 80 vol % to the resin material. Further, when the dielectric constant of the resin material is too low, the effects are small. Whereas, too high dielectric constant thereof results in inferior radio wave radiation efficiency. Therefore, the dielectric constant is preferably set to be about 6 to 20.

Figure 4:
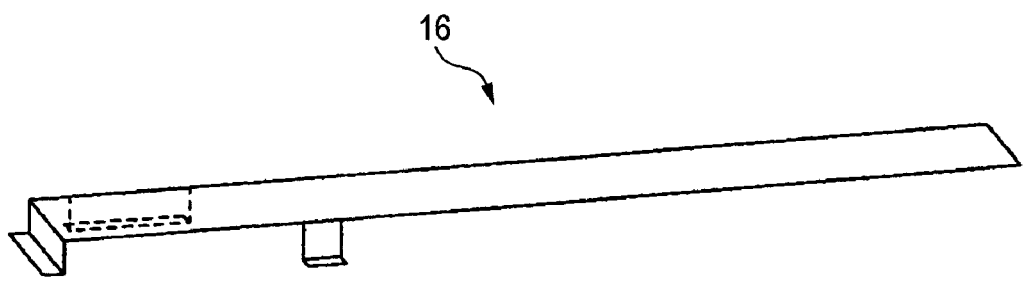
FIG. 4 is a perspective view of an antenna for use in the electronic apparatus of FIG. 3.

FIG. 4 is a perspective view showing the antenna 16 for use in the electronic apparatus 10. The antenna 16 is formed by bending a plate-like electrically conductive material of, for example, Cu. Thus, it has the shape of a so-called inversed F type antenna. Such an inversed F type antenna is an antenna using resonance. Therefore, it is preferably formed in such a shape (size) that the impedance is a prescribed value. Thus, it is difficult to ensure the mounting space for the inversed F type antenna in the related art. Further, with a related-art communication unit, there may be adopted a method in which the antenna and the communication module are separated from each other, and mounted separately.

Under such circumstances, in this example, such an inversed F type antenna is mounted on a substrate including a communication module mounted thereon, and sealed together with electronic components for forming the communication module with a resin material. For this reason, it is possible to integrally mount the electronic components and the antenna, and to reduce the size of the electronic apparatus.

Further, the antenna and the elements are integrally sealed as described above. Therefore, the electronic apparatus 10 can also be configured such that a part of the antenna 16 and the mounted electronic components overlap in plan configuration, which is advantageous for reducing the size of the electronic apparatus.

Figure 5:
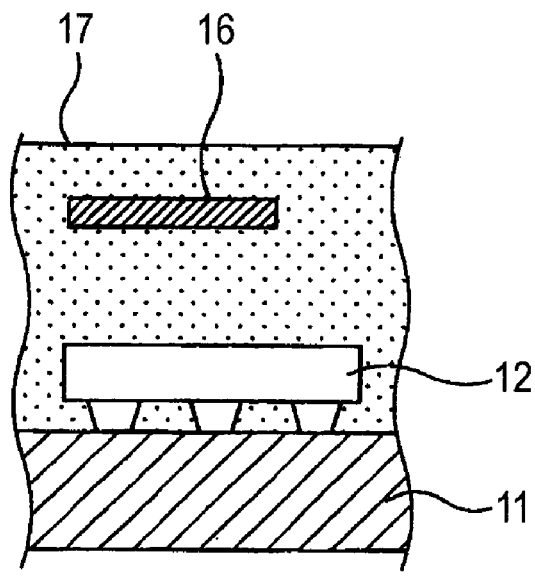
FIG. 5 is a cross sectional view of the electronic apparatus of FIG. 3.

FIG. 5 shows the cross section along X-X' of the electronic apparatus 10 of FIG. 3. By reference to FIG. 5, mounting is accomplished such that at least a part of the antenna 16 lies over the electronic components (e.g., electronic component 12) mounted on the wiring substrate 11. The arrangement is accomplished such that the electronic components and at least a part of the antenna 16 overlap in plan configuration.

Figure 1:
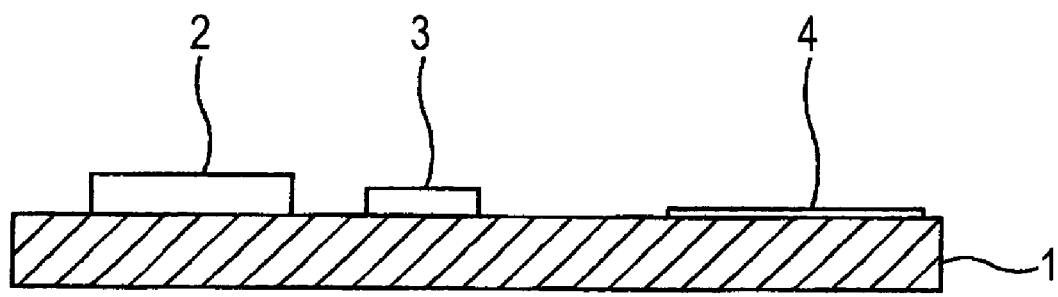
FIG. 1 is a view (first) showing a related-art electronic apparatus.
Figure 2:
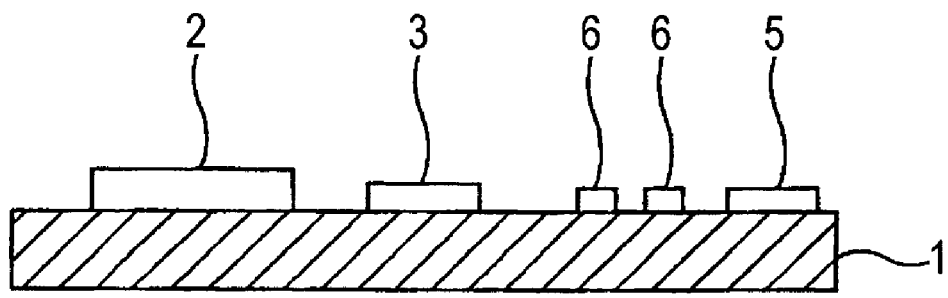
FIG. 2 is a view (second) showing a related-art electronic apparatus.

For this reason, for example, as compared with a related-art electronic apparatus described previously in connection with FIG. 1 or 2, in which the electronic components and the antenna are required to be mounted substantially on the same plane on the wiring substrate, for the electronic apparatus in accordance with this example, it is possible to arrange the antenna and the electronic components in a narrower space. Therefore, in accordance with this example, it becomes possible to reduce the size of the electronic apparatus including both the electronic components and the antenna mounted therein.

Further, the present invention is not limited to the exemplary example. Example 1 may be variously changed/modified as shown in Examples 2 to 4 below.

Example 2

Figure 6:
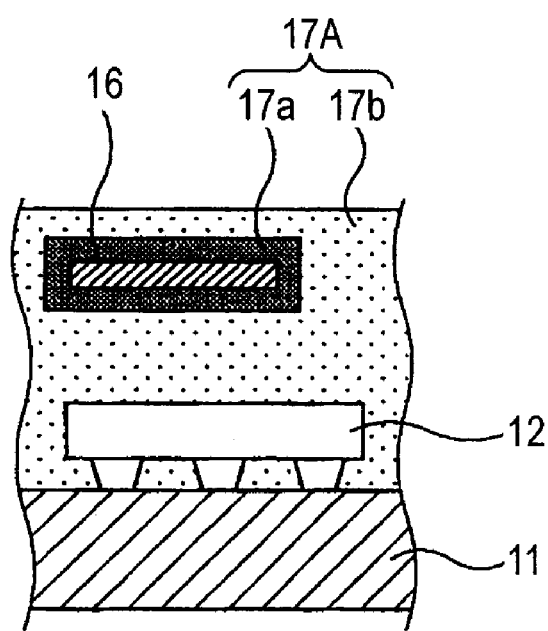
FIG. 6 is a cross sectional view of an electronic apparatus in accordance with Example 2.

FIG. 6 is a view showing an electronic apparatus in accordance with Example 2 of the present invention, and a view corresponding to FIG. 5 of Example 1. However, the elements described previously are given the same reference numerals and signs, and the description may be omitted. Further, the element not particularly described has the same structure as that of the electronic apparatus of Example 1.

By reference to FIG. 6, the electronic apparatus in accordance with the present invention is wherein a resin material 17A corresponding to the resin material 17 of Example 1 includes a resin material 17a and a resin material 17b having different dielectric constants.

Namely, in the case of this example, a dielectric constant adjusting material is added such that the dielectric constant of the resin material 17A sealing the electronic components 12 to 15 (shown in FIG. 3) and the antenna 16 is higher in the vicinity of the antenna 16 (resin material 17a) than in the vicinity of the electronic components 12 to 15 (resin material 17b).

This enables the following. The dielectric constant is set low (e.g., about 4) in the vicinity of the electronic components, so that the parasitic capacitance applied on the electronic components and wiring is reduced. Thus, while keeping the operation speed of the communication module, the reduction of the size of the antenna is implemented.

In the case of this example, the following structure (double mold structure) is adopted. The resin material 17a containing a dielectric constant adjusting material added therein, and having a high dielectric constant is formed so as to cover the periphery of the antenna 16. The antenna 16 covered with the resin material 17a is further sealed with the resin material 17b.

When the electronic apparatus in accordance with this example is formed, it is essential only that the following procedure may be performed. First, the antenna 16 covered with the resin material 17a is mounted on the wiring substrate 11. By the use of the resin material 17b having a dielectric constant lower than that of the resin material 17a, the antenna 16 covered with the resin material 17a is sealed. Alternatively, when the antenna 16 covered with the resin material 17a is formed, the antenna 16 is covered with the resin material 17a by, for example, electrostatic adsorption.

Example 3

Figure 7:
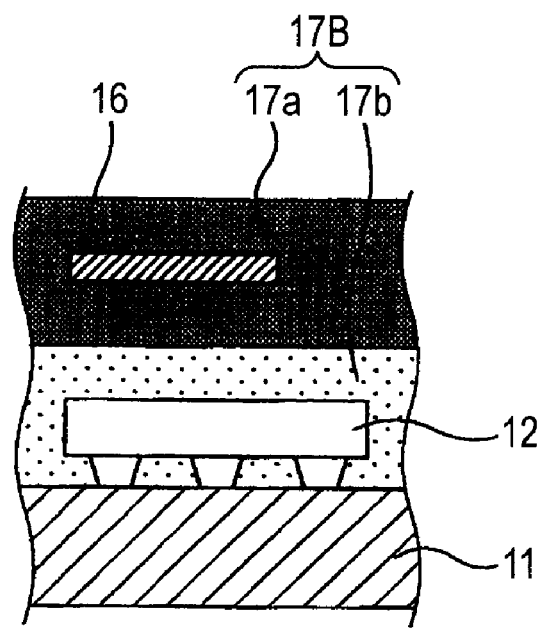
FIG. 7 is a cross sectional view of an electronic apparatus in accordance with Example 3.

Whereas, FIG. 7 is a view showing an electronic apparatus in accordance with Example 3 of the present invention, and a view corresponding to FIG. 5 of Example 1. However, the elements described previously are given the same reference numerals and signs, and the description is omitted. Further, the element not particularly described has the same structure as that of the electronic apparatus of Example 1.

In the case shown in this diagram, as with the case shown in Example 2 (FIG. 6), a dielectric constant adjusting material is added such that the dielectric constant of the resin material 17B sealing the electronic components 12 to 15 (shown in FIG. 3) and the antenna 16 is higher in the vicinity of the antenna 16 (resin material 17a) than in the vicinity of the electronic components 12 to 15 (resin material 17b). For this reason, the same effects as in the case of Example 2 are produced. However, in the case of this example, it is a feature that the resin material 17B has a two-layer structure in which resin materials having different dielectric constants are stacked one on another.

Namely, for the lower layer (the vicinity of the electronic components 12 to 15 and the wiring substrate 11), the resin material 17b having a low dielectric constant is formed. Whereas, for the upper layer (around the antenna 16), the resin material 17a containing the dielectric constant adjusting material added therein, and having a high dielectric constant is formed.

For this reason, as compared with Example 2, it is easier to form a resin material varying in dielectric constant from one part thereof to another. Incidentally, when the foregoing structure is formed, for example, it is essential only that sealing is carried out in the order of the resin material 17b and the resin material 17a.

Example 4

Figure 8:
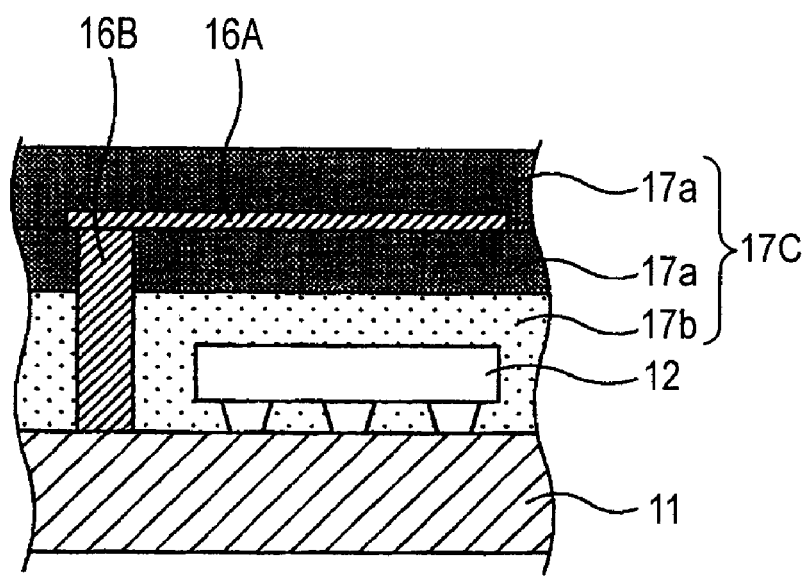
FIG. 8 is a cross sectional view of an electronic apparatus in accordance with Example 4.

FIG. 8 is a view showing an electronic apparatus in accordance with Example 4 of the present invention, and a view corresponding to FIG. 5 of Example 1. However, the elements described previously are given the same reference numerals and signs, and the description is omitted. Further, the element not particularly described has the same structure as that of the electronic apparatus of Example 1.

In the case of this example, the resin material 17C is, as with the case of the resin material 17B, has a two-layer structure of the resin material 17b having a low dielectric constant and a resin material 17a containing a dielectric constant adjusting material added therein, and having a high dielectric constant.

In the case of this example, it is a feature that an antenna 16A corresponding to the antenna 16 of Example 1 is formed by patterning. For example, when the electronic apparatus shown in this diagram is manufactured, it is essential only that the following procedure is carried out.

First, on the wiring substrate 11, the electronic components 12 to 15 (shown in FIG. 3) are mounted. Then, these electronic components 12 to 15 are sealed with the resin material 17b having a low dielectric constant.

Then, on the resin material 17b, the resin material 17a containing a dielectric constant adjusting material added therein, and having a high dielectric constant is stacked. Herein, a via hole penetrating through the resin materials 17a and 17b is formed. Further, the via hole is filled up, for example, with a plating method to form a via plug 16B.

Then, on the resin material 17a, the antenna 16A to be connected to the via plug 16B is formed by patterning. The antenna 16A can be formed by, for example, sputtering using a mask pattern, CVD, or deposition. Alternatively, it may also be formed in the following manner. An electrically conductive film covering the resin material 17a is formed, and then, the electronically conductive film is subjected to pattern etching. Then, the resin material 17a is formed again so as to cover the formed antenna 16A.

In this manner, it is possible to form the antenna 16A covered with the resin material 17a.

In accordance with this example, it is easy to micromachine the pattern shape of the antenna. This enables further miniaturization and reduction of the size of the electronic apparatus.

Up to this point, the preferred embodiments of the present invention were described. However, the present invention is not limited to such specific embodiments, and various modifications/changes are possible within the scope of the gist described in the appended claims.

In accordance with the present invention, it becomes possible to reduce the size of an electronic apparatus including an electronic component and an antenna mounted therein.

What is claimed is:

1. An electronic apparatus comprising:
   a substrate;
   an electronic component mounted on the substrate;
   an antenna mounted on the substrate, said antenna having a first portion adjacent said substrate and a second portion spaced from said substrate; and
   a resin material containing a dielectric constant adjusting material added therein, wherein a first portion of said resin material containing the dielectric constant adjusting material added therein seals the electronic component and the first portion of the antenna while a second portion of said resin material containing the dielectric constant adjusting material added therein seals the second portion of said antenna,
   wherein the dielectric constant adjusting material is added such that the dielectric constant of the second portion of the resin is higher than the dielectric constant of the first portion of the resin.

2. The electronic apparatus according to claim 1, wherein the dielectric constant adjusting material includes SiC or SiN.

3. The electronic apparatus according to claim 1, wherein the dielectric constant adjusting material includes a metal compound, and said metal compound includes any of Al, Ti, Ta, and Zr.

4. The electronic apparatus according to claim 3, wherein the metal compound includes $Al_2O_3$ or AlN.

5. The electronic apparatus according to claim 1, wherein the dielectric constant of the resin material prior to the dielectric constant adjusting material being added therein is 4, and wherein the dielectric constant of the resin material is adjusted by adding the dielectric constant adjusting material therein to be greater than or equal to 8 and less than or equal to 20.

6. The electronic apparatus according to claim 1, wherein the dielectric constant adjusting material is added to the resin material so as to be greater than or equal to 70 vol % and less than or equal to 80 vol % to the resin material.

7. The electronic apparatus according to claim 1, wherein the electronic component mounted on the substrate is disposed between the substrate and the second portion of the antenna.

8. The electronic apparatus according to claim 1, wherein the first portion of the resin material is formed in a first layer on the substrate so as to seal the electronic component and the first portion of the antenna and the second portion of the resin material is formed in a second layer on top of the first layer so as to be spaced from the substrate by the first layer and so as to seal the second portion of the antenna.

9. The electronic apparatus according to claim 8, wherein the first portion of the resin material is formed in the first layer directly on the substrate, and the second portion of the resin material is formed in the second layer directly on the first layer.

10. The electronic apparatus according to claim 1, wherein the antenna is mounted directly on the substrate and extends therefrom through the first portion of the resin material and into the second portion of the resin material.

11. The electronic apparatus according to claim 1, wherein the dielectric constant adjusting material is substantially uniformly added to the resin material.

12. The electronic apparatus according to claim 1, wherein the second portion of the resin material is formed as a coating on the second portion of the antenna so as to cover the second portion of the antenna, and the first portion of the resin material is formed in a layer so as to seal the electronic component, the first portion of the antenna, and the second portion of the resin material.

13. The electronic apparatus according to claim 1, wherein at least a part of the second portion of the antenna overlays the electronic component mounted on the substrate.

14. The electronic apparatus according to claim 1, wherein the first portion of the antenna is mounted directly on the substrate.

15. The electronic apparatus according to claim 1, wherein the first portion of the antenna is mounted directly on the substrate at a position which is spaced from the electronic component, and a part of the second portion of the antenna projects from the first portion of the antenna such that said part of the second portion of the antenna overlays the electronic component.

16. The electronic apparatus according to claim 15, wherein the first portion of the antenna perpendicularly extends from the substrate, and said part of the second portion of the antenna is disposed perpendicularly to the first portion of the antenna.

* * * * *